United States Patent
Liang et al.

(10) Patent No.: US 11,552,639 B2
(45) Date of Patent: Jan. 10, 2023

(54) LOW VOLTAGE DIFFERENTIAL SIGNALING DRIVER

(71) Applicant: NXP USA, INC., Austin, TX (US)

(72) Inventors: Yongqin Liang, Shanghai (CN); Lei Tian, Shanghai (CN); Xiaowen Wu, Shanghai (CN); Jingjian Zhang, Shanghai (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/343,164

(22) Filed: Jun. 9, 2021

(65) Prior Publication Data

US 2022/0014196 A1    Jan. 13, 2022

(30) Foreign Application Priority Data

Jun. 16, 2020 (CN) .......................... 202010551175.7

(51) Int. Cl.
   *H03K 19/0185* (2006.01)
(52) U.S. Cl.
   CPC ........................ *H03K 19/018528* (2013.01)
(58) Field of Classification Search
   None
   See application file for complete search history.

(56) References Cited

U.S. PATENT DOCUMENTS

| | | |
|---|---|---|
| 5,877,634 A | 3/1999 | Hunley |
| 6,281,715 B1 | 8/2001 | DeClue et al. |
| 7,154,309 B1 | 12/2006 | Talbot et al. |
| 7,924,056 B2 | 4/2011 | Kumar et al. |
| 2007/0252619 A1 | 11/2007 | Bitting |
| 2013/0162318 A1* | 6/2013 | Kameda ......... H03K 19/018528 327/333 |

FOREIGN PATENT DOCUMENTS

CN    101674072 B    10/2011

OTHER PUBLICATIONS

Abugharbieh, K., "An Ultralow-Power 10-Gbits/s LVDS Output Driver", IEEE Transactions on Circuits and Systems—I: Regular Papers, vol. 57, No. 1, Jan. 2010.
Chen, M., "Low-Voltage Low-Power LVDS Drivers", IEEE Journal of Solid-State Circuits, vol. 40, No. 2, Feb. 2005.

(Continued)

*Primary Examiner* — Jany Richardson

(57) ABSTRACT

A low voltage differential driver includes a first driver, a second driver, and an output driver. The output driver is configured to provide an output between a first output node and a second output node, and includes a current source, a first branch, and a second branch. The current source is configured to provide a source current. The current source is connected with a parallel arrangement of the first branch and the second branch. The first switch and the second switch are respectively controlled by a first switch circuit and a second switch circuit which together comprise the first driver. The third switch and the fourth switch are respectively controlled by a third switch circuit and a fourth switch circuit which together comprise the second driver. Each of the first to fourth switch circuits is connected between the upper node and the lower node.

20 Claims, 4 Drawing Sheets

(56) References Cited

OTHER PUBLICATIONS

Marar, H., "A Power Efficient 3-Gbits/s 1,8V PMOS-Based LVDS Output Driver", 2012 19th IEEE International Conference on Electronics, Circuits, and Systems (ICECS 2012), Dec. 9-12, 2012.

Tajalli, A., "A Slew Controlled LVDS Output Driver Circuit in 0.18 um CMOS Technology", IEEE Journal of Solid-State Circuits, vol. 44, No. 2, Feb. 2009.

\* cited by examiner

LOW VOLTAGE DIFFERENTIAL SIGNALING DRIVER

CROSS-REFERENCE TO RELATED APPLICATIONS

This application claims the priority under 35 U.S.C. § 119 of China Patent application no. 202010551175.7, filed on 16 Jun. 2020, the contents of which are incorporated by reference herein.

BACKGROUND

The present disclosure relates to a low voltage differential signaling (LVDS) driver.

Low voltage differential signaling (LVDS) transmission is advantageous in its low voltage, low power consumption, and immunity against noises. FIG. 1 shows a circuit diagram of a LVDS transmission system. The LVDS transmission system 100 includes a driver 102 and a receiver 104. The driver 102 includes a current source 106, and first to fourth transistors 108, 110, 112, and 114. The current source 106 provides a current which, according to the standard TIA-EIA0-644-A-2001, preferably is 3.5 mA. The first transistor 108 and the second transistor 110 are series connected between the current source 106 and ground. The third transistor 112 and the fourth transistor 114 are series connected between the current source 106 and ground.

The first transistor 108 and the fourth transistor 114 are conductive in response to a first input signal applied to gate (control) terminals thereof. The second transistor 110 and the third transistor 112 are conductive in response to a second input signal applied to gate (control) terminals thereof. The driver 102 provides an output signal at a first node 116 between the first and the second transistors 108 and 110, and a second node 118 between the third and the fourth transistors 112 and 114.

The receiver 104 includes a termination resistor 120 and a comparator 122. The comparator 122 has a reverse input terminal and a non-reverse input terminal each coupled with a corresponding one of the first node 116 and the second node 118 of the driver 102. The resistor 120 is coupled between reverse and non-reverse input terminals of the comparator 122. The resistor 120 has a resistance of preferably 100 ohms. The comparator 122 is configured to have a high DC input impedance so the current of the output signal transmitted from the driver 102 mainly flows through the termination resistor 120 to cause a voltage difference between the input terminals of the comparator 122. As described, the voltage difference is around 350 mV.

As a polarity of the current of the output signal of the driver 102 changes due to the switching of the first to fourth transistors 108 to 114, the polarity of the voltage difference between the input terminals of the comparator 122 toggles to cause a logic status of an output of the comparator 122 to change.

LVDS transmissions allow processing of the signals to focus on the voltage differences on the terminals of the comparator 122, for example 350 mV in this example. Accordingly, LVDS transmission is power efficient and reliable. As critical dimensions (CD) of the process for fabricating the transistors shrink to 14 nm or even 7 nm, power supplies are being lowered to 1.8 V or less. This brings challenges to the transistors to meet the LVDS requirements.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, a low voltage differential driver includes a first driver, a second driver, and an output driver. The output driver is configured to provide an output between a first output node and a second output node, and includes a current source, a first branch, and a second branch. The current source is configured to provide a source current. The current source is connected with a parallel arrangement of the first branch and the second branch connected between an upper node and a lower node. The first branch includes a first switch, a second switch, and the first output node therebetween. The second branch is connected in parallel with the first branch, and includes a third switch, a fourth switch, and the second output node. The first switch and the second switch are respectively controlled by a first switch circuit and a second switch circuit which together comprise the first driver. The third switch and the fourth switch are respectively controlled by a third switch circuit and a fourth switch circuit which together comprise the second driver. Each of the first to fourth switch circuits is connected between the upper node and the lower node.

In another embodiment, a low voltage differential driver includes an output driver, a first pre-driver, and a second pre-driver. The output driver includes a current source configured to provide a source current. The output driver further includes a first switch and a second switch that are series connected between the current source and a second voltage. The first switch and the second switch alternately close, and allow a differential signal driven by the current source to flow through a first node between the first and second switches. The output driver further includes a third switch and a fourth switch that are series connected between the current source and the second voltage. The third switch and the fourth switch alternately close, and allow the differential signal to flow through a second node between the third and fourth switches. The first pre-driver is connected between the current source and a second voltage, and is configured to receive an input signal, and generate a first switch signal and a second switch signal to be respectively provided to control terminals of the first and second switches of the output driver. The second pre-driver is connected between the current source and the second voltage, and is configured to receive the input signal, and generate a third switch signal and a fourth switch signal to be respectively provided to control terminals of the third and fourth switches of the output driver.

BRIEF DESCRIPTION OF THE DRAWINGS

So that the manner in which the above recited features of the present disclosure can be understood in detail, a more detailed description of the disclosure may be had by reference to embodiments, some of which are illustrated in the appended drawings. The appended drawings illustrate only typical embodiments of the disclosure and should not limit the scope of the disclosure, as the disclosure may have other equally effective embodiments. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
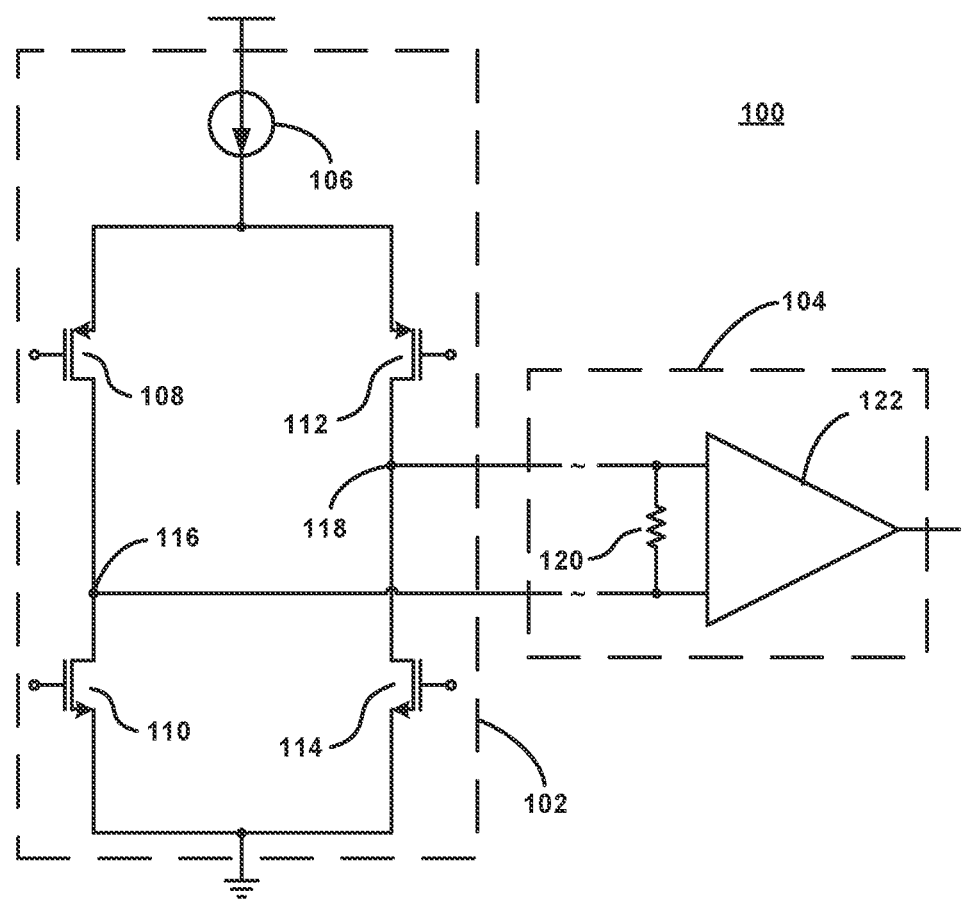
FIG. 1 is a circuit diagram of a low voltage differential signaling transmission system.
Figure 2:
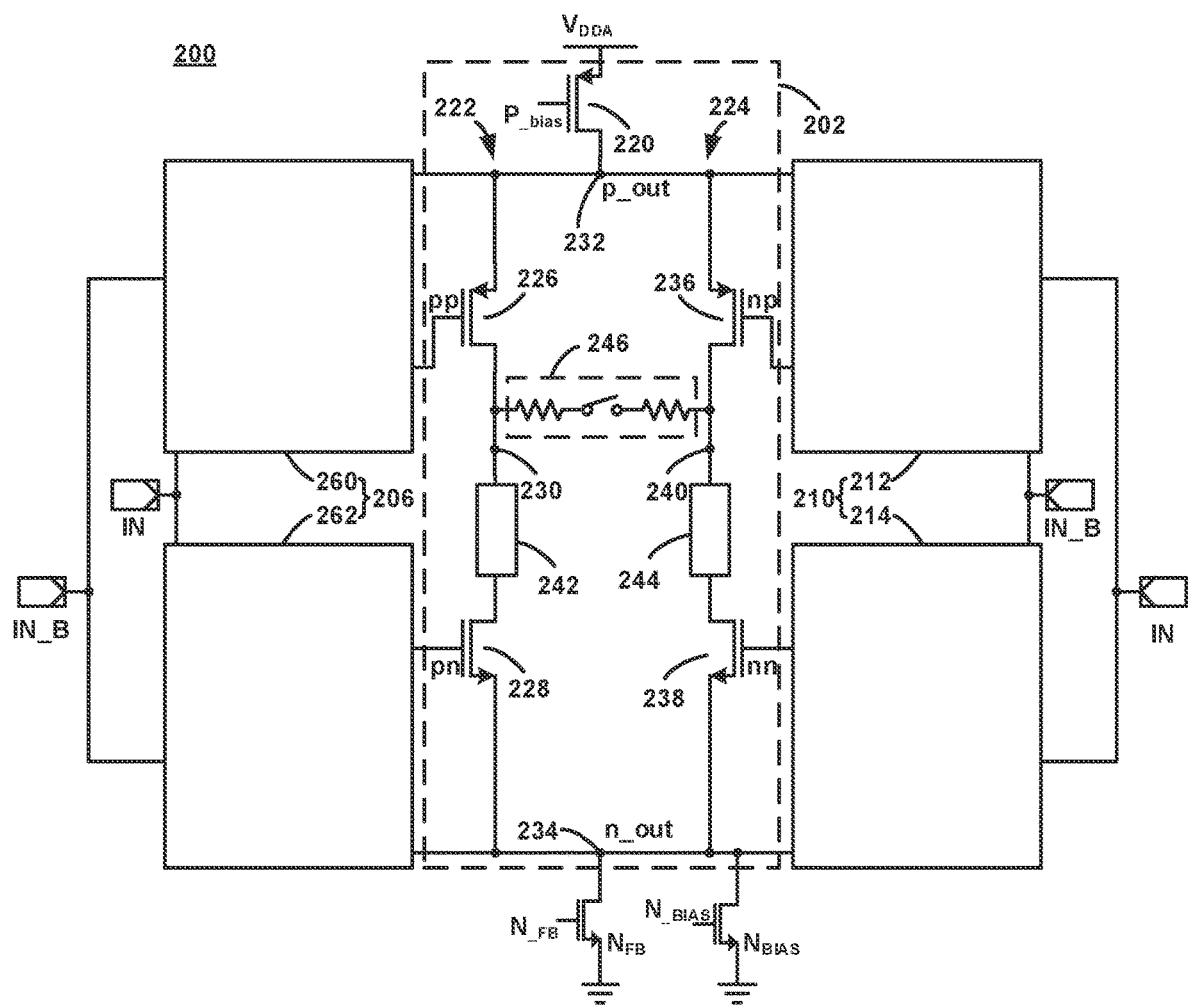
FIG. 2 is a block diagram of a current mode low voltage differential signaling driver according to an embodiment.

FIG. 2 is a block diagram of a current mode low voltage differential signaling driver according to an embodiment of the present disclosure. The low voltage differential signaling (LVDS) driver 200 includes an output driver 202, a first driver 206 or first pre-driver 206, and a second driver 210 or second pre-driver 210. The output driver 202 includes a current source 220 which operates under a supply voltage $V_{DDA}$, and provide a source current, similar to the current source 106 of FIG. 1. The source current is 3.5 mA according to standard TIA-EIA0-644-A-2001. In detail, the current source 220 can be implemented as a PMOS transistor having a gate terminal receiving a bias signal $P_{\_bias}$, a source terminal connected to receive the supply voltage $V_{DDA}$, and a drain terminal providing the source current.

Similar to the driver 102 of FIG. 1, the output driver 202 of the present embodiment include a first branch 222 and a second branch 224 connected in parallel. In detail, the first branch 222 includes a first switch 226 and a second switch 228 connected in series. A first node 230 between the first switch 226 and the second switch 228 is used for allowing a differential signal driven by the current source 220 to flow. In this embodiment, the first switch 226 is a PMOS transistor, and the second switch 228 is an NMOS transistor. Other switch elements are applicable in alternative embodiments. As described, controlled by switch signals provided to gate terminals of the transistors 226 and 228, the first switch 226 and the second switch 228 alternately close. A first switch signal pp is provided to a gate terminal (control terminal) of the PMOS transistor 226 to switch the PMOS transistor 226 on/off, and a second switch signal pn is provided to a gate or control terminal of the NMOS transistor 228 to switch the NMOS transistor 228 on/off. The first driver 206 includes a first switch circuit 260 and a second switch circuit 262. The first switch circuit 260 receives an input signal IN and an inverted version IN_B of the input signal, and provides the first switch signal pp to the first switch 226 of the output driver 202. The second switch circuit 262 receives the input signal IN and the inverted version IN_B of the input signal, and provides the second switch signal pn to the second switch 228 of the output driver 202.

In detail, the first switch 226 has the gate or control terminal receiving the first switch signal pp, a source terminal connected to the current source 220 by way of a supply node 232 having a first voltage level p_out to receive the source current, and a drain terminal connected to the first node 230. The second switch 228 has the gate terminal (control terminal) receiving the second switch signal pn, a drain terminal coupled to the first node 230, and a source terminal connected to a ground node 234. The coupling between the drain terminal of the second switch 228 and the first node 230 may be by a direct connection, or may be through a further component 242 which will be described in more detail hereinbelow.

According to one or more embodiments, the ground node 234 is connected to a ground level by way of a feedback transistor $N_{FB}$ which is an NMOS transistor receiving a feedback signal $N_{\_FB}$ as a control signal. The feedback signal $N_{\_FB}$ can be abstracted from the differential signal provided by the output driver 202, and cause the a drain terminal of the feedback transistor $N_{FB}$ connecting to the ground node 234 to have a second voltage level n_out. In one or more embodiments, a bias transistor $N_{BIAS}$ may also be connected between the ground node 234 and the ground level. As shown, the bias transistor $N_{BIAS}$ is an NMOS transistor having a gate terminal receiving a bias control signal $N_{\_BIAS}$, a drain terminal connected to the ground node 234, and a source terminal connected to the ground level. The bias transistor $N_{BIAS}$ can be used for further adjusting the second voltage level n_out on the ground node 234, and shrink a constant ground current of around 1 mA, to avoid the common mode feedback loop of the output driver 202 to enter an infinite loop (endless loop) when the first voltage level p_out on the supply node 232 and the second voltage level n_out on the ground node 234 are close enough to each other.

The second branch 224 similarly includes a third switch 236 and a fourth switch 238 connected in series. A second node 240 between the third switch 236 and the fourth switch 238 allows the differential signal to flow through. In the present embodiment, the third switch 236 is a PMOS transistor, and the fourth switch 238 is an NMOS transistor, while in alternative embodiments other switch elements are also applicable. The third switch 236 and the fourth switch 238 are controlled to be alternately closed. A third switch signal np is provided to a gate or control terminal of the PMOS transistor 236 to switch on/off the PMOS transistor 236, and a fourth switch signal nn is provided to the gate or control terminal of the NMOS transistor 238 to switch on/off the NMOS transistor 238. The second driver 210 includes a third switch circuit 212 and a fourth switch circuit 214. The third switch circuit 212 receives the input signal IN and the inverted version IN_B of the input signal, and provides the third switch signal np to the third switch 236 of the output driver 202. The fourth switch circuit 214 receives the input signal IN and the inverted version IN_B of the input signal, and provides the fourth switch signal nn to the fourth switch 238 of the output driver 202.

In detail, the third switch 236 has the gate or control terminal receiving the third switch signal np, a source terminal connected to the supply node 232, and a drain terminal connected to the second node 240. The fourth switch 238 has the gate or control terminal receiving the fourth switch signal nn, a drain terminal coupled to the second node 240, and a source terminal connected to the ground node 234. The coupling between the drain terminal of the fourth switch 238 and the second node 240 may be by a direct connection, or may be through a further component 244 which will be described in more detail hereinbelow.

In operation, the differential signal driven by the current source 220 flows through the first node 230, a termination resistor not shown in FIG. 2 but similar to the termination resistor 120 of FIG. 1, and the second node 240, and causes a voltage difference between the first node 230 and the second node 240. As the terminal resistor typically has a resistance of 100 ohms, the voltage difference between the first node 230 and the second node 240 is around 350 mV. Because the switches of the output driver 202 have, in an on-state, drain-source voltage drops that are sufficiently small to be ignored, the voltage difference between the first voltage level p_out on the supply node 232 and the second voltage level n_out on the ground node 234 is also around 350 mV. For further distinguishing the voltage difference of around 350 mV from threshold voltage values of the switch transistor, the output driver 202 may further include a first voltage drop element 242 connected between the first node 230 and the second switch 228, and a second voltage drop element 244 connected between the second node 240 and the fourth switch 238.

Figure 3:
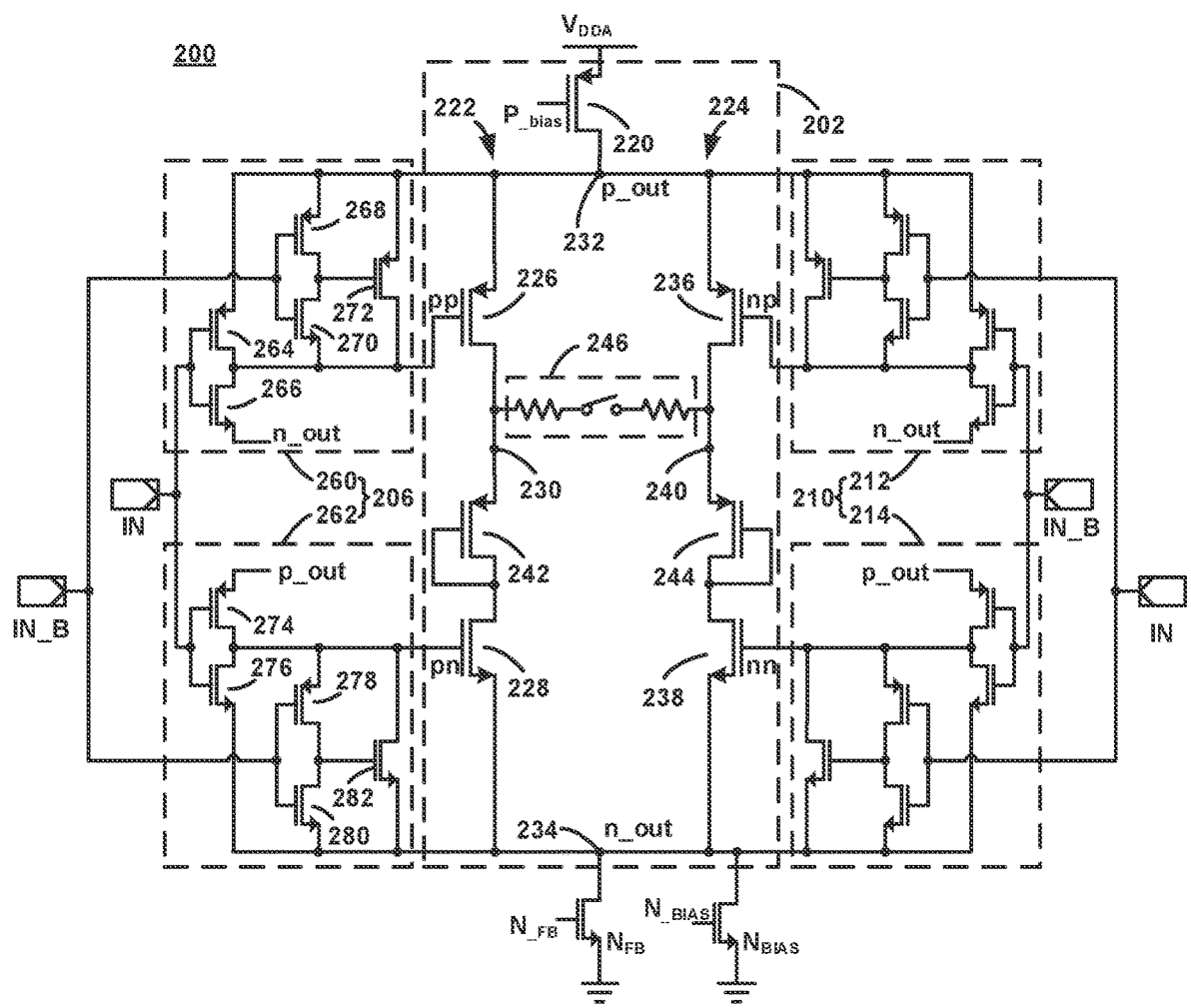
FIG. 3 is a detailed circuit diagram of the current mode low voltage differential signaling driver of FIG. 2.

Referring now to FIG. 3, details of the first to fourth switch circuits 260, 262, 212, and 214, and the first and second voltage drop elements 242 and 244 are depicted. As shown, the first voltage drop element 242 may be a diode-connected PMOS transistor having its gate terminal connected to its drain terminal and to the drain terminal of the second switch 228, and its source terminal connected to the first node 230. Similarly, the second voltage drop element 244 may be a diode-connected PMOS transistor having its gate terminal connected to its drain terminal and to the drain terminal of the fourth switch 238, and its source terminal connected to the second node 240. The first voltage drop element 242 and the second voltage drop element 244 increase the voltage difference between the voltage levels on the first node 230 and the second node 240, and accordingly add a value to the voltage difference between the first voltage level p_out on the supply node 232 and the second voltage level n_out on the ground node 234 to about 800 mV-900 mV. As is known, the threshold voltage of a transistor is defined as the voltage difference between the voltage levels applied on gate and source terminals of the transistor. The source terminal voltage approximates the threshold value, which makes it difficult to apply a gate terminal voltage signal to switch the transistors. The increased voltage difference due to the voltage drop elements 242 and 244 may enhance the switching of the transistors of the LVDS driver 200. Additionally, the first and second voltage drop elements 242 and 244 allows the voltage difference between the first voltage level p_out and the second voltage level n_out to follow the fabrication process variations, and stabilizes an output impedance of the first pre-driver 206 and the second pre-driver 210 as both pre-drivers operate under the first and second voltage levels.

The first pre-driver 206 and the second pre-driver 210 are connected in parallel with the first branch 222 and the second branch 224 between the supply node 232 and the ground node 234, to operate in a voltage range between the first voltage level p_out and the second voltage level n_out. It can be understood from FIG. 2 and FIG. 3 that the voltage range between the first voltage level p_out and the second voltage level n_out is less than a voltage range between the supply voltage $V_{DDA}$ and the ground level. As described, a required common-mode voltage of the differential signal is 1.2V, which further requires the supply voltages $V_{DDA}$ to be typically 1.8V and 1.62V (10% shrunk to 1.8V) as a minimum. However, process shrinking results in reduced device sizes and maximum tolerable voltages, for example threshold voltages $V_{th}$ for transistors. Supplying the devices of the LVDS driver 200 with the reduced voltage range between the first voltage level p_out on the supply node 232 and the second voltage level n_out on the ground node 234 may enable the devices fabricated in advanced processes, for example 14 nm FinFET process, to be operable with reduced power consumption and leakage.

As described, the first pre-driver 206 and the second pre-driver 210 both receive the input signal IN and the inverted version IN_B of the input signal. The inverted version IN_B of the input signal may be provided for example by a single-ended to differential signal generator (not shown) from the input signal. As shown in FIG. 3, all of the first to fourth switch circuits 260, 262, 212, and 214 operate in the voltage range between the first voltage level p_out and the second voltage level n_out. Since the first pre-driver 206 and the second pre-driver 210 have symmetrical structures, only the first switch circuit 260 and the second switch circuit 262 of the first pre-driver 206 will be described in detail hereinafter.

The first switch circuit 260 includes a first PMOS transistor 264, a first NMOS transistor 266, a second PMOS transistor 268, a second NMOS transistor 270, and a third PMOS transistor 272. The first PMOS transistor 264 has a gate or control terminal connected to receive the input signal IN, a source terminal connected to the current source 220 to be coupled with the first voltage level p_out, and a drain terminal connected to the gate or control terminal of the first switch 226 to provide the first switch signal pp. The first NMOS transistor 266 has a gate (control) terminal connected to the gate terminal of the first PMOS transistor 264, and receives the input signal IN, a source terminal coupled to the second voltage level n_out, and a drain terminal connected to the drain terminal of the first PMOS transistor 264 and the gate or control terminal of the first switch 226. The first PMOS transistor 264 and the first NMOS transistor 266 connect as an inverter which receives the input signal IN, and provides an inverter signal of the input signal IN as the first switch signal pp to the first switch 226.

The second PMOS transistor 268 of the first switch circuit 260 has a gate or control terminal connected to receive the inverted version IN_B of the input signal, a source terminal connected to the current source 220 to be coupled with the first voltage level p_out, and a drain terminal. The second NMOS transistor 270 of the first switch circuit 260 has a gate (control) terminal connected to the gate or control terminal of the second PMOS transistor 268 and receives the inverted version IN_B of the input signal, a source terminal connected to drain terminals of the first PMOS transistor 264 and the first NMOS transistor 266, and a drain terminal connected to the drain terminal of the second PMOS transistor 268. The third PMOS transistor 272 of the first switch circuit 260 has a gate (control) terminal connected to drain terminals of the second PMOS transistor 268 and the second NMOS transistor 270, a source terminal coupled with the first voltage level p_out, and a drain terminal connected to the control (gate) terminal of the first switch 226 to provide the first switch signal pp. The second PMOS transistor 268, the second NMOS transistor 270, and the third PMOS transistor 272 of the first switch circuit 260 connect as a diode-connection circuit which receives the inverted version IN_B of the input signal, and provides the first switch signal pp to the first switch 226.

Similar to the first switch circuit 260, the second switch circuit 262 also includes a first PMOS transistor 274 and a first NMOS transistor 276 connecting as an inverter between the first voltage level p_out and the second voltage level n_out. The first PMOS transistor 274 the first NMOS transistor 276 each receives the input signal IN at the gate terminal thereof, and provides the second switch signal pn at the drain terminal thereof to the gate or control terminal of the second switch 228. A source terminal of the first PMOS transistor 274 of the second switch circuit 262 is connected to the first voltage level p_out, and a source terminal of the first NMOS transistor 276 of the second switch circuit 262 is connected to the second voltage level n_out.

Further, the second switch circuit 262 also includes a diode-connection circuit receiving the inverted version IN_B of the input signal and providing the second switch signal pn to the second switch 228. Different from the diode-connection circuit of the first switch circuit 260, the diode-connection circuit of the second switch circuit 262 includes a second PMOS transistor 278, a second NMOS transistor 280, and a third NMOS transistor 282. The second PMOS transistor 278 of the second switch circuit 262 has a gate or control terminal connected to receive the inverted version IN_B of the input signal, a source terminal connected to drain terminals of the first PMOS transistor 274 and the first NMOS transistor 276, and a drain terminal. The second NMOS transistor 280 of the second switch circuit 262 has a gate or control terminal connected to the gate (control) terminal of the second PMOS transistor 278 and receives the inverted version IN_B of the input signal, a source terminal coupled to the second voltage level n_out, and a drain terminal connected to the drain terminal of the second PMOS transistor 278 of the second switch circuit 262. The third NMOS transistor 282 of the second switch circuit 262 has a gate terminal connected to the drain terminals of the second PMOS transistor 278 and the second NMOS transistor 280, a source terminal coupled to the second voltage level n_out, and a drain terminal connected to the gate or control terminal of the second switch 228 and provides the second switch signal pn.

The third switch circuit 212 of the second pre-driver 210 is similarly configured as the first switch circuit 260 of the first pre-driver 206, except that the inverter-connected PMOS and NMOS transistors receive the inverted version IN_B of the input signal, and that the diode-connection circuit receives the input signal IN. The fourth switch 214 of the second pre-driver 210 is similarly configured as the second switch circuit 262 of the first pre-driver 206, except that the inverter-connected PMOS and NMOS transistors receive the inverted version IN_B of the input signal, and that the diode-connection circuit receives the input signal IN.

The input signal IN and its inverted version IN_B are provided to the first pre-driver 206 and the second pre-driver 210 such that, the first switch 226 and the second switch 228 of the first branch 222 alternately close, and the third switch 236 and the fourth switch 238 alternately close. In detail, when the first switch 226 and the fourth switch 238 close while the second switch 228 and the third switch 236 open, the source current driven by the current source 220 flows through the first switch 226, the first node 230, the termination resistor (not shown in FIG. 2), the second node 240, and the fourth switch 238. When the first switch 226 and the fourth switch 238 open while the second switch 228 and the third switch 236 close, the source current driven by the current source 220 flows through the third switch 236, the second node 240, the termination resistor, and first node 230, and the second switch 228.

Figure 4:
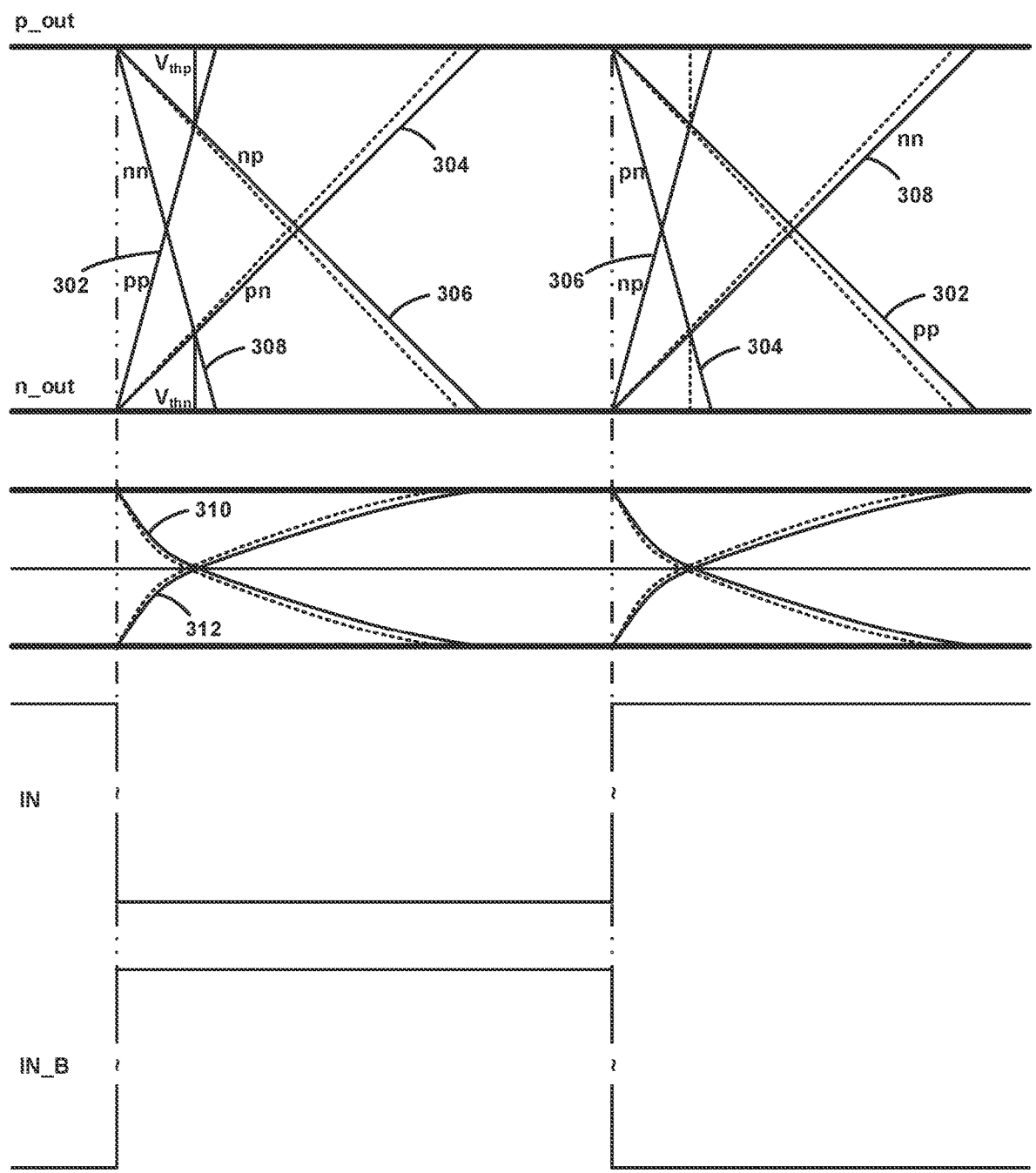
FIG. 4 is a schematic diagram of the switch signals and output signals of the driver of FIG. 2 and FIG. 3 according to an embodiment.

Switching the first switch 226 and the second switch 228 of the first branch 222 in the output driver 202 will be described. The switching of the third switch 236 and the fourth switch 238 of the second branch 224 is similar with reference to the first branch 222. FIG. 4 is a schematic diagram showing the first to fourth switch signals applying to the switches in the output driver basing on the input signal IN and the inverted version IN_B of the input signal, and outputs of the output driver of FIG. 3. The diagram of FIG. 4 will be described in detail for the first pre-driver 206, i.e. the first switch signal pp denoted as 302 and the second switch signal pn denoted as 304. The input signal IN and the inverted version IN_B of the input signal typically swing in a voltage range of 0 to 1.8V, which is much larger than that of the first to fourth switch signals.

In the first branch 222 of the output driver 202, the first switch 226 and the second switch 228 are preferably not closed simultaneously to avoid significant leakage. To turn on the second switch 228, the second switch signal pn is required to be increased until a threshold voltage value $V_{thn}$ of the second switch 228, i.e. the NMOS transistor, is reached. Meanwhile, the first switch signal pp applying to the first switch 226 also increases to shut off the PMOS transistor 226. As shown in FIG. 4, both the first switch signal pp and the second switch signal pn increase. For increasing the first and second switch signals pp and pn, the input signal IN decreases while the inverted version IN_B of the input signal increases. For the first switch circuit 260 of the first pre-driver 206, the input signal IN dropped below a threshold voltage value of the first NMOS transistor 266 shuts down the first NMOS transistor 266, and allows the first switch signal pp provided at the drain terminal of the first NMOS transistor 266 to be pulled up by the diode-connection circuit with the increase of the inverted version IN_B of the input signal. For the diode-connection circuit, as the inverted version IN_B of the input signal increases, the second NMOS transistor 270 become conductive to pull down the voltage on the gate terminal of the third PMOS transistor 272 and switch the third PMOS transistor 272 conductive. The conductive third PMOS transistor 272 provides at the drain terminal the first switch signal pp with an increasing voltage level and, when increased exceeding the threshold voltage $V_{thp}$ of the first switch 226, shuts the first switch 226 off.

Similarly, in the second switch circuit 262, the increasing inverted version IN_B of the input signal applied to the diode-connection of the second switch circuit 262 turns the second NMOS transistor 280 conductive and shuts the third NMOS transistor 282 off, and allows the second switch signal pn to be pulled up by the first PMOS transistor 274. The decreasing input signal IN operates to switch on the first PMOS transistor 274 when dropped below the threshold voltage value of the first PMOS transistor 274, and pulls the second switch signal pn provided on the drain terminal of the first PMOS transistor 274 up. As can be seen from FIG. 4, with the increasing of the first and second switch signals pp and pn, an output 310 on the first node 230 decreases from the first voltage level p_out, and gradually drops to the second voltage level n_out after crossing the common voltage $V_{cm}$. On the other side of the LVDS driver 200, the decreasing input signal IN and the increasing inverted version IN_B of the input signal pulls both the third switch signal np denoted by 306 and the fourth switch signal nn denoted by 308 down. The decreasing third switch signal np switches the PMOS transistor 236 conductive, and the decreasing fourth switch signal nn shuts the NMOS transistor 238 off. As a result, the output 312 on the second node 240 increases from the second voltage level n_out until the first voltage level p_out.

Later on, after the output 312 on the second node 240 is fully set, the input signal IN starts increasing to turn the first switch 226 conductive while switch off the second switch 228. The increasing input signal IN switches on the first NMOS transistor 276 of the second switch circuit 262, and pulls down the second switch signal pn until below the threshold voltage value $V_{thn}$ of the second switch 228. The second switch 228 is thereby switched off. The input signal IN provided to the gate terminal of the first NMOS transistor 266 in the first switch circuit 260 increases exceeding the threshold voltage value of the first NMOS transistor 266, switches on the first NMOS transistor 266, and pulls the first switch signal pp provided on the drain terminal of the first NMOS transistor 266 down to the second voltage level n_out. The first switch signal pp having a voltage level below the threshold voltage value $V_{thp}$ of the first switch 226 turns the first switch 226 conductive.

Skilled person will appreciate, switch circuits 212, 214, 260, and 262 determine slew rates of the gate signals on the respective switches. Accordingly, slew rates of the switch signals pp, pn, np, and nn are configurable with the device configurations of the switch circuits, for example sizes of the first NMOS transistor 266 of the first switch circuit 260, and the first PMOS transistor 274 of the second switch circuit 262, etc. Dash lines in FIG. 4 depict the switch signals and the output signals on the first and second nodes 230 and 240 with controlled slew rates. Referring back to FIG. 2 and FIG. 3, in one or more embodiments, an on-die termination resistor 246 may be connected between the first node 230 and the second node 240, as shown. The on-die termination resistor 246 is controlled by an enable signal odt_en, to be coupled in the output driver 202 in a high speed mode. The on-die termination resistor 246, when enabled, is connected local to the output driver 202, to improve the transmission of the output LVDS signal with reduced signal delay and enhanced performance.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the disclosure as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A low voltage differential driver comprising:
    an output driver to provide an output between a first output node and a second output node, wherein the output driver comprises:
        a current source configured to provide a source current and connected with a parallel arrangement of a first branch and a second branch connected between an upper node and a lower node;
        the first branch comprising a first switch, a second switch, and the first output node therebetween, the first branch further comprising a first voltage drop element connected between the first switch and the second switch, the first voltage drop element being a first diode-connected PMOS transistor; and
        the second branch in parallel with the first branch and comprising a third switch, a fourth switch, and the second output node therebetween, the second branch further comprising a second voltage drop element connected between the third switch and the fourth switch, the second voltage drop element being a second diode-connected PMOS transistor; wherein
    the first switch and the second switch are respectively controlled by a first switch circuit and a second switch circuit which together comprise a first driver;
    the third switch and the fourth switch are respectively controlled by a third switch circuit and a fourth switch circuit which together comprise a second driver; and wherein
    each of the first to fourth switch circuits is connected between the upper node and the lower node.

2. The driver of claim 1, wherein the output driver further comprises a termination resistor connected between the first output node and the second output node.

3. The driver of claim 1, wherein the first switch circuit of the first driver comprises:
    a first PMOS transistor having a source terminal connected to the upper node, a gate terminal connected to receive the input signal, and a drain terminal connected to the control terminal of the first switch;
    a first NMOS transistor having a drain terminal connected to the drain terminal of the first PMOS transistor, a gate terminal connected to the gate terminal of the first PMOS transistor and receives the input signal, and a source terminal connected to the lower node; and
    a diode-connection circuit operable to receive an inverted version of the input signal, and provide the first switch signal to the first switch.

4. The driver of claim 3, wherein the diode-connection circuit comprises:
    a second PMOS transistor having a gate terminal connected to receive the inverted version of the input signal, a source terminal connected to the upper node, and a drain terminal;
    a second NMOS transistor having a gate terminal connected to the gate terminal of the second PMOS transistor and receives the inverted version of the input signal, a drain terminal connected to the drain terminal of the second PMOS transistor, and a source terminal connected to the control terminal of the first switch; and
    a third PMOS transistor having a gate terminal connected to the drain terminals of the second PMOS transistor and the second NMOS transistor, a source terminal connected to the upper node, and a drain terminal connected to the control terminal of the first switch.

5. The driver of claim 1, wherein the second switch circuit of the first driver comprises:

a first PMOS transistor having a source terminal connected to the upper node, a gate terminal connected to receive the input signal, and a drain terminal connected to the control terminal of the second switch;

a first NMOS transistor having a drain terminal connected to the drain terminal of the first PMOS transistor, a gate terminal connected to receive the input signal, and a source terminal connected to the lower node; and a diode-connection circuit operable to receive an inverted version of the input signal, and provide the second switch signal to the second switch.

6. The driver of claim 5, wherein the diode-connection circuit comprises:

a second PMOS transistor having a gate terminal connected to receive the inverted version of the input signal, a source terminal connected to the control terminal of the second switch, and a drain terminal;

a second NMOS transistor having a gate terminal connected to the gate terminal of the second PMOS transistor and receives the inverted version of the input signal, a drain terminal connected to the drain terminal of the second PMOS transistor, and a source terminal connected to the lower node; and a third NMOS transistor having a gate terminal connected to drain terminals of the second PMOS transistor and the second NMOS transistor, a source terminal connected to the lower node, and a drain terminal connected to the control terminal of the second switch.

7. The driver of claim 1, wherein the third switch circuit of the second driver comprises:

a first PMOS transistor having a source terminal connected to the upper node, a gate terminal connected to receive an inverted version of the input signal, and a drain terminal connected to the control terminal of the third switch;

a first NMOS transistor having a drain terminal connected to the drain terminal of the first PMOS transistor, a gate terminal connected to the gate terminal of the first PMOS transistor and receives the inverted version of the input signal, and a source terminal connected to the lower node; and a diode-connection circuit operable to receive the input signal, and provide the third switch signal to the third switch.

8. The driver of claim 7, wherein the diode-connection circuit comprises:

a second PMOS transistor having a gate terminal connected to receive the input signal, a source terminal connected to the upper node, and a drain terminal;

a second NMOS transistor having a gate terminal connected to the gate terminal of the second PMOS transistor and receives the input signal, a drain terminal connected to the drain terminal of the second PMOS transistor, and a source terminal connected to the control terminal of the third switch; and a third PMOS transistor having a gate terminal connected to the drain terminals of the second PMOS transistor and the second NMOS transistor, a source terminal connected to the upper node, and a drain terminal connected to the control terminal of the third switch.

9. The driver of claim 1, wherein the fourth switch circuit of the second driver comprises:

a first PMOS transistor having a source terminal connected to the upper node, a gate terminal connected to receive an inverted version of the input signal, and a drain terminal connected to the control terminal of the fourth switch;

a first NMOS transistor having a drain terminal connected to the drain terminal of the first PMOS transistor, a gate terminal connected to receive the inverted version of the input signal, and a source terminal connected to the lower node; and a diode-connection circuit operable to receive the input signal, and provide the fourth switch signal to the fourth switch.

10. The driver of claim 9, wherein the diode-connection circuit comprises:

a second PMOS transistor having a gate terminal connected to receive the input signal, a source terminal connected to the control terminal of the fourth switch, and a drain terminal;

a second NMOS transistor having a gate terminal connected to the gate terminal of the second PMOS transistor and receives the input signal, a drain terminal connected to the drain terminal of the second PMOS transistor, and a source terminal connected to the lower node; and a third NMOS transistor having a gate terminal connected to drain terminals of the second PMOS transistor and the second NMOS transistor, a source terminal connected to the lower node, and a drain terminal connected to the control terminal of the fourth switch.

11. The driver of claim 1, wherein
the first switch and the third switch are PMOS transistors; and
the second switch and the fourth switch are NMOS transistors.

12. A low voltage differential driver comprising:
an output driver comprising:
a current source configured to provide a source current;
a first switch and a second switch that are series connected between the current source and a second voltage, wherein the first switch and the second switch alternately close, and allow a differential signal driven by the current source to flow through a first node between the first and second switches; and
a third switch and a fourth switch that are series connected between the current source and the second voltage, wherein the third switch and the fourth switch alternately close, and allow the differential signal to flow through a second node between the third and fourth switches;
a first pre-driver connected between the current source and a second voltage and configured to receive an input signal, and generate a first switch signal and a second switch signal to be respectively provided to control terminals of the first and second switches of the output driver; and
a second pre-driver connected between the current source and the second voltage and configured to receive the input signal, and generate a third switch signal and a fourth switch signal to be respectively provided to control terminals of the third and fourth switches of the output driver.

13. The driver of claim 12, wherein the output driver further comprises:
a first voltage drop element connected between the first node and the second switch to cause the series connection of the first and second switches to operate in a first voltage range between a first voltage and a second voltage, wherein the first voltage range is less than a second voltage range between a supply voltage provided to the current source and a ground level;

a second voltage drop element connected between the second node and the fourth switch to cause the series connection of the third and fourth switches operate in the first voltage range.

14. The driver of claim 13, wherein the first voltage drop element and the second voltage drop element are diode-connected PMOS transistors.

15. The driver of claim 12, wherein the first pre-driver comprises:
a first PMOS transistor having a gate terminal configured to receive the input signal, a source terminal connected to the current source, and a drain terminal connected to the first switch;
a first NMOS transistor having a gate terminal connected to the gate terminal of the first PMOS transistor and configured to receive the input signal, a source terminal connected to the second voltage, and a drain terminal connected to the drain terminal of the first PMOS transistor;
a second PMOS transistor having a gate terminal configured to receive an inverted version of the input signal, a source terminal connected to the current source, and a drain terminal;
a second NMOS transistor having a gate terminal connected to the gate terminal of the second PMOS transistor and configured to receive the inverted version of the input signal, a source terminal connected to drain terminals of the first PMOS transistor and the first NMOS transistor; and a drain terminal connected to the drain terminal of the second PMOS transistor; and
a third PMOS transistor having a gate terminal connected to drain terminals of the second PMOS transistor and the second NMOS transistor, a source terminal connected to the current source, and a drain terminal connected to the first switch to provide the first switch signal.

16. The driver of claim 12, wherein the first pre-driver comprises:
a first PMOS transistor having a gate terminal configured to receive the input signal, a source terminal connected to the current source, and a drain terminal connected to the second switch;
a first NMOS transistor having a gate terminal connected to the gate terminal of the first PMOS transistor and receives the input signal, a source terminal connected to the second voltage, and a drain terminal connected to the drain terminal of the first PMOS transistor;
a second PMOS transistor having a gate terminal configured to receive an inverted version of the input signal, a source terminal connected to drain terminals of the first PMOS transistor and the first NMOS transistor, and a drain terminal;
a second NMOS transistor having a gate terminal connected to the gate terminal of the second PMOS transistor and configured to receive the inverted version of the input signal, a source terminal connected the second voltage; and a drain terminal connected to the drain terminal of the second PMOS transistor; and
a third NMOS transistor having a gate terminal connected to drain terminals of the second PMOS transistor and the second NMOS transistor, a source terminal connected to the second voltage, and a drain terminal connected to the second switch to provide the second switch signal.

17. The driver of claim 12, wherein the second pre-driver comprises:

a first PMOS transistor having a gate terminal configured to receive an inverted version of the input signal, a source terminal connected to the current source, and a drain terminal connected to the third switch;
a first NMOS transistor having a gate terminal connected to the gate terminal of the first PMOS transistor and receives the inverted version of the input signal, a source terminal connected to the second voltage, and a drain terminal connected to the drain terminal of the first PMOS transistor;
a second PMOS transistor having a gate terminal configured to receive the input signal, a source terminal connected to the current source, and a drain terminal;
a second NMOS transistor having a gate terminal connected to the gate terminal of the second PMOS transistor and configured to receive the input signal, a source terminal connected to drain terminals of the first PMOS transistor and the first NMOS transistor; and a drain terminal connected to the drain terminal of the second PMOS transistor; and
a third PMOS transistor having a gate terminal connected to drain terminals of the second PMOS transistor and the second NMOS transistor, a source terminal connected to the current source, and a drain terminal connected to the third switch to provide the third switch signal.

18. The driver of claim 12, wherein the second pre-driver comprises:
a first PMOS transistor having a gate terminal configured to receive an inverted version of the input signal, a source terminal connected to the current source, and a drain terminal connected to the fourth switch;
a first NMOS transistor having a gate terminal connected to the gate terminal of the first PMOS transistor and receives the inverted version of the input signal, a source terminal connected to the second voltage, and a drain terminal connected to the drain terminal of the first PMOS transistor;
a second PMOS transistor having a gate terminal configured to receive the input signal, a source terminal connected to drain terminals of the first PMOS transistor and the first NMOS transistor, and a drain terminal;
a second NMOS transistor having a gate terminal connected to the gate terminal of the second PMOS transistor and configured to receive the input signal, a source terminal connected the second voltage; and a drain terminal connected to the drain terminal of the second PMOS transistor; and
a third NMOS transistor having a gate terminal connected to drain terminals of the second PMOS transistor and the second NMOS transistor, a source terminal connected to the second voltage, and a drain terminal connected to the fourth switch to provide the fourth switch signal.

19. A low voltage differential driver comprising:
an output driver to provide an output between a first output node and a second output node, wherein the output driver comprises:
a current source configured to provide a source current and connected with a parallel arrangement of a first branch and a second branch connected between an upper node and a lower node;
the first branch comprising a first switch, a second switch, and the first output node therebetween, the first switch circuit comprising:

a first PMOS transistor having a source terminal connected to the upper node, a gate terminal connected to receive an input signal, and a drain terminal connected to a control terminal of the first switch;

a first NMOS transistor having a drain terminal connected to the drain terminal of the first PMOS transistor, a gate terminal connected to the gate terminal of the first PMOS transistor and receives the input signal, and a source terminal connected to the lower node; and a diode-connection circuit operable to receive an inverted version of the input signal, and provide a first switch signal to the first switch; and the second branch in parallel with the first branch and comprising a third switch, a fourth switch, and the second output node therebetween; wherein the first switch and the second switch are respectively controlled by a first switch circuit and a second switch circuit which together comprise a first driver;

the third switch and the fourth switch are respectively controlled by a third switch circuit and a fourth switch circuit which together comprise a second driver; and wherein each of the first to fourth switch circuits is connected between the upper node and the lower node.

20. The driver of claim 19, wherein the first switch and the third switch are PMOS transistors; and the second switch and the fourth switch are NMOS transistors.

* * * * *